United States Patent
Fuchs et al.

(10) Patent No.: US 9,291,722 B2
(45) Date of Patent: Mar. 22, 2016

(54) SCINTILLATOR PLATE

(71) Applicants: Manfred Fuchs, Nürnberg (DE); Jürgen Korinth, Erlangen (DE)

(72) Inventors: Manfred Fuchs, Nürnberg (DE); Jürgen Korinth, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/409,828

(22) PCT Filed: May 16, 2013

(86) PCT No.: PCT/EP2013/060186
§ 371 (c)(1),
(2) Date: Dec. 19, 2014

(87) PCT Pub. No.: WO2013/189673
PCT Pub. Date: Dec. 27, 2013

(65) Prior Publication Data
US 2015/0153462 A1    Jun. 4, 2015

(30) Foreign Application Priority Data

Jun. 21, 2012    (DE) .......................... 10 2012 210 487

(51) Int. Cl.
| | | |
|---|---|---|
| G01T 1/10 | (2006.01) | |
| G01T 1/20 | (2006.01) | |
| G01J 1/58 | (2006.01) | |
| C23C 14/06 | (2006.01) | |
| G21K 4/00 | (2006.01) | |

(52) U.S. Cl.
CPC ............... *G01T 1/20* (2013.01); *C23C 14/0694* (2013.01); *G01J 1/58* (2013.01); *G01T 1/2012* (2013.01); *G21K 4/00* (2013.01); *G21K 2004/04* (2013.01); *G21K 2004/10* (2013.01)

(58) Field of Classification Search
CPC .................. H01L 27/14658; H01L 27/14676; G01T 1/20; G01T 1/2012; G21K 2004/10; G21K 2004/04
See application file for complete search history.

(56) References Cited

U.S. PATENT DOCUMENTS

| | | |
|---|---|---|
| 4,123,308 A | 10/1978 | Nowlin et al. |
| 4,628,208 A * | 12/1986 | Arakawa .................... 250/484.4 |
| 2003/0038249 A1 | 2/2003 | Hackenschmied et al. |

(Continued)

FOREIGN PATENT DOCUMENTS

| | | |
|---|---|---|
| DE | 19509438 A1 | 9/1995 |
| DE | 4433132 A1 | 3/1996 |

(Continued)

OTHER PUBLICATIONS

Hongliang Huang et al, "Effects of Film Thickness on Moisture Sorption, Glass Transition Temperature and Morphology of Poly (chloro-p-xylylene) Film", Science Direct, 2005, pp. 5949-5955, Polymer 46, Elsevier.

(Continued)

*Primary Examiner* — Kiho Kim
(74) *Attorney, Agent, or Firm* — Lempia Summerfield Katz LLC

(57) ABSTRACT

A scintillator plate includes a substrate, a buffer layer, a scintillator layer arranged on the buffer layer, and a protective layer. The buffer layer and/or the protective layer is colored. A method for the production of the scintillator plate is also described.

6 Claims, 3 Drawing Sheets

(56) References Cited

U.S. PATENT DOCUMENTS

| | | |
|---|---|---|
| 2003/0071228 A1* | 4/2003 | Bergh et al. ............... 250/484.4 |
| 2004/0094718 A1 | 5/2004 | Fuchs et al. |
| 2004/0126489 A1 | 7/2004 | Fuchs et al. |
| 2007/0051896 A1* | 3/2007 | Okada et al. ............ 250/370.11 |
| 2009/0065705 A1 | 3/2009 | Fuchs et al. |
| 2010/0207031 A1 | 8/2010 | Leppert |
| 2011/0017912 A1 | 1/2011 | Goto et al. |

FOREIGN PATENT DOCUMENTS

| | | |
|---|---|---|
| DE | 10116803 A1 | 10/2002 |
| DE | 10242006 A1 | 3/2004 |
| DE | 102009009051 A1 | 11/2010 |
| EP | 1793457 A2 | 6/2007 |
| EP | 1997866 A1 | 12/2008 |
| WO | 2007131844 A1 | 11/2007 |
| WO | 2010026789 A1 | 3/2010 |

OTHER PUBLICATIONS

International Search Report and Written Opinion in corresponding PCT Application No. PCT/EP2013/060186, dated Aug. 9, 2013, with English translation.

T. Usui et al., "60 mm Diameter Lu0.4Gd1.65i05: Ce (LGSO) Single Crystals and Their Improved Scintillation Properties", The Institution of Engineering and Technology, Feb. 2007, pp. 19-22, vol. 54, No. 1, IEEE Transactions on Nuclear Science.

V.V. Nagarkar et al., "Structured CsI (TI) Scintillators for X-ray Imaging Applications", IEEE Transactions on Nuclear Science, Jun. 1998, pp. 492-496, vol. 45, No. 3.

* cited by examiner

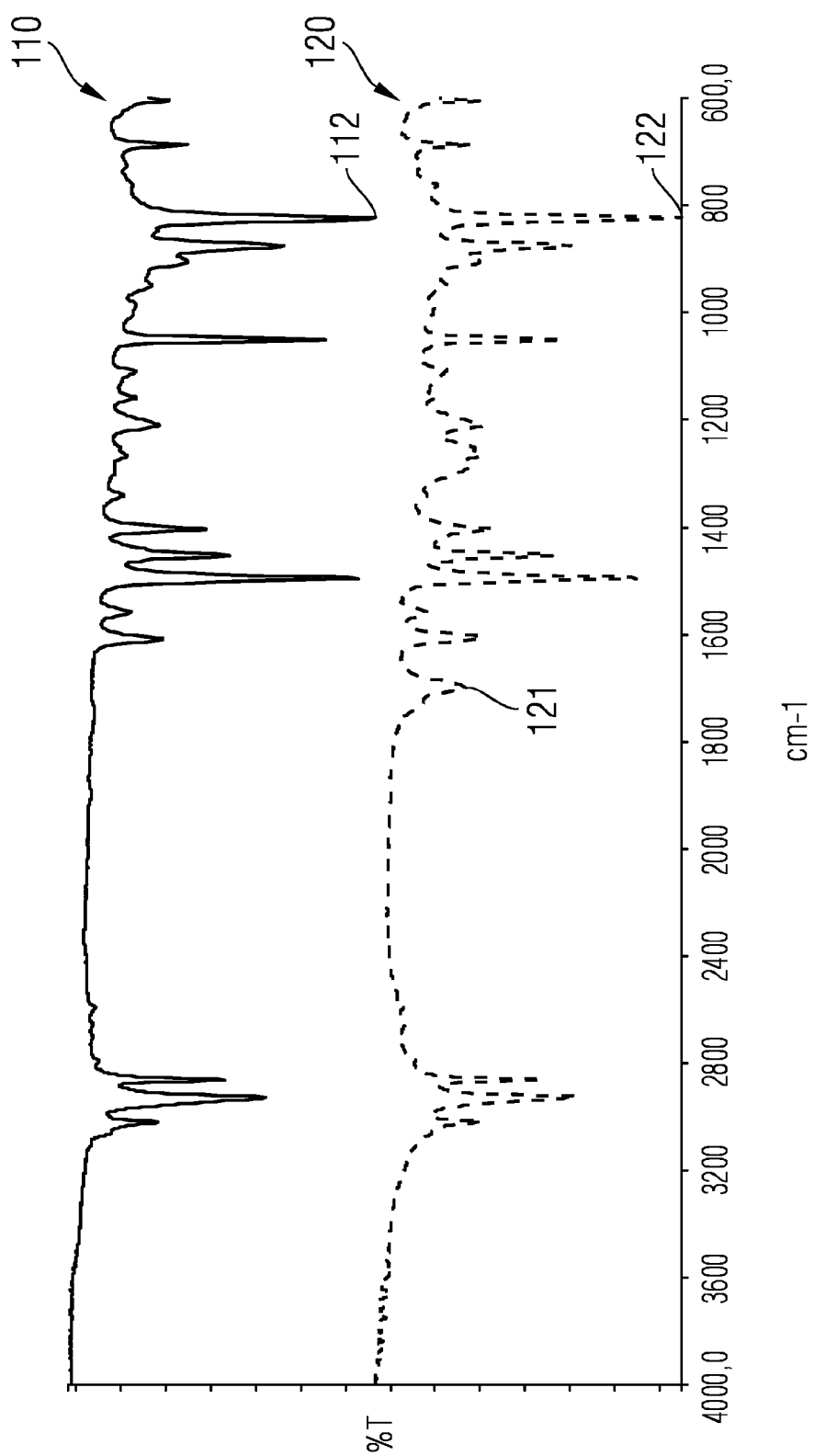

SCINTILLATOR PLATE

The present patent document is a §371 nationalization of PCT Application Serial Number PCT/EP2013/060186, filed May 16, 2013, designating the United States, which is hereby incorporated by reference in its entirety. This patent document also claims the benefit of DE 10 2012 210 487.9, filed on Jun. 21, 2012, which is also hereby incorporated by reference in its entirety.

FIELD

The present invention relates to a scintillator plate for detecting X-rays and to a method for producing a scintillator plate.

BACKGROUND

Scintillator plates serve to convert X-ray or gamma radiation into visible light and are used in medical technology and for non-destructive material testing. Typically, scintillator plates include a substrate on which a scintillator layer is arranged. The material of a scintillator layer is suitable for absorbing high-energy photons of X-ray and gamma radiation and for re-emitting the energy of the high-energy photons in the form of a large number of low-energy photons, e.g., in the visible region (therefore referred to in the following as light photons). It is thereby possible to process the information of the X-ray or gamma radiation with common optical sensors. The two-dimensional detection of an image is possible when using a matrix of photodetectors, such as for example CCD sensors made of crystalline silicon or photodiode arrays made of amorphous silicon.

In order to achieve a high resolution in the image, as many as possible of the light photons generated by a single high-energy photon are received by a single photodetector of the matrix in order to obtain the information concerning the spatial correlation.

One of the scintillator materials used is caesium iodide (referred to below as CsI). A scintillator layer made of CsI is typically generated by vapor-deposition of CsI onto a substrate in a vacuum. The CsI tends, under suitable manufacturing conditions, to form columnar microstructures or needles, which are separate from one another and which grow upwardly away from the substrate. The microstructures typically have structure sizes in the lateral direction of the order of 10 µm. Due to the effect of total reflection, these microstructures are suitable for conducting a large part of the photons generated in the interior thereof along the microstructure, similarly to a light guide. Only light photons that meet the surface at too large an angle leave the respective microstructure and scatter in the wider surroundings.

If the layer thickness of the scintillator layer is selected to be larger, the microstructures tend to grow together and to come into contact with one another. This effect arises, e.g., in layer thicknesses from 300 µm upward. At contact sites of this type, the conditions, in part, no longer exist for total reflection, so that additional light photons are scattered out of the microstructures. Such layer thicknesses are used, e.g., when X-ray or gamma radiation with relatively high energies is used because, with the increasing energy, the absorption in the CsI decreases. The scintillator layer is configured thicker in order to absorb the majority of the X-ray or gamma photons. Typical layer thicknesses may be between 500 µm and 2000 µm. At these layer thicknesses, the spatial resolving power is consequently significantly reduced due to the light photons emerging laterally from the microstructures.

In order to counteract this effect, as described in the published application DE 10242006 A1, it has been attempted to structure the scintillator layer in a targeted manner. As mentioned above, however, from a thickness of 300 µm, said scintillator layer tends to grow together again, so that at greater layer thicknesses, the desired effect cannot be achieved.

In published applications DE 4433132 A1 and DE 10116803 A1, there are described attempts to color the surface of the microstructures in order to absorb light photons emerging laterally from the microstructure. However, the coloration is not restricted to the surface, but also extends into the interior of the microstructures. A raised level of absorption of the light photons in the interior of the microstructure is also associated therewith, which leads to a reduction in the desired signal.

The publication "Structured CsI (Tl) Scintillators for X-Ray Imaging Applications" by V. V. Nagarkar, IEEE Transactions on Nuclear Science, vol. 45, No. 3, June 1998, describes covering the microstructures with an optically absorptive protective layer.

The patent specification EP 1 793 457 B1 describes covering the microstructures completely from the base to the tip with a light photon-absorbing covering material. A covering of this type has a refractive index close to that of caesium iodide and therefore restricts the total reflection to relatively flat incident angles to the border layer between the caesium iodide and the covering material, such that more light photons enter the covering material and are absorbed there.

Protective layers made of parylene are known from the patent document U.S. Pat. No. 4,123,308 and the published application DE 19509438 A1.

SUMMARY AND DESCRIPTION

The present embodiments may obviate one or more of the drawbacks or limitations in the related art. For example, the present embodiments may address a problem in scintillator plates that the contrast and/or the resolution decreases with increasing thickness of the scintillator layer.

The present embodiments may provide a scintillator plate that has better contrast, greater conversion efficiency and/or a higher resolution with a comparable thickness of the scintillator layer.

The present embodiments relate to a scintillator plate having a substrate, a scintillator layer and a protective layer. A method may be provided for producing a scintillator plate of this type.

The method for producing a scintillator plate includes providing a substrate. A buffer layer is applied to the substrate. The application of a scintillator layer onto the substrate is provided. A protective layer is applied to the scintillator layer. The buffer layer and/or the protective layer is colored by tempering.

Because the buffer layer and/or the protective layer is colored by tempering, there is no danger that coloring substances will enter the scintillator layer and reduce the efficiency of the scintillator layer through absorption of the propagating light photons there. However, due to the coloring, the protective layer has a raised absorption for scattered light photons. For example, if the light photons do not pass through the protective layer by the shortest route, the light photons propagate at an angle to the propagation direction of the generating gamma or X-ray photons and take a longer path in the protective layer. Thus, due to the absorption of these non-directed light photons, the contrast and the resolution of the scintillator plate is improved. In this way, a colored buffer layer reduces the number of light photons that leave the scintillator layer in the direction toward the substrate at an angle and fall, reflected back from the substrate, in the direction of a detector. Because these light photons are also diffusely distributed around the original generation site, the absorption of the light photons in the buffer layer also improves the resolution and the contrast of the scintillator plate.

The scintillator plate includes a substrate, a buffer layer on a surface of the substrate, a scintillator layer arranged on the buffer layer, and a protective layer. The buffer layer and/or the protective layer include a proportion of carbonyl groups, such that the buffer layer and/or the protective layer have a yellowish coloration.

Due to the yellowish coloration of the protective layer, the protective layer has a raised absorption for scattered light photons, e.g., if the light photons do not pass through the protective layer by the shortest route, but propagate at an angle to the propagation direction of the generating gamma or X-ray photon and take a longer path in the protective layer. Thus, due to the absorption of these non-directed photons, the contrast and the resolution of the scintillator plate are improved. In the same way, a colored buffer layer reduces the number of light photons that leave the scintillator layer in the direction toward the substrate and fall, reflected back from the substrate, in the direction of a detector. Because these light photons are also distributed diffusely around the original generation site, due to the absorption thereof, the resolution and the contrast of the scintillator plate are also improved. The yellow coloration of the buffer layer and/or of the protective layer due to the carbonyl groups may be generated, for example, by tempering in an oxygen-containing atmosphere. Such coloration effects may occur with carbonyl proportions of, for example, more than 5000 ppm, where the coloration and the raised oxygen content levels may be limited to regions of the layer. The coloration may be useful because absorption of light in the visible wavelength region is provided without the protective layer being changed by pigments or coloring agents. The carbonyl groups arise in the buffer layer or the protective layer itself and do not pass into the scintillator layer where the carbonyl groups would reduce the conversion efficiency thereof.

The protective layer may be made of a parylene from the substance group of poly-p-xylylenes, in particular, one of parylene C, parylene N or parylene D.

Parylene C, for example, may be deposited from a gaseous phase and does not require water or solvent for application. A water-impervious protective film is formed, which protects the scintillator layer against moisture. This is useful, e.g., for the hygroscopic caesium iodide. Furthermore, parylene C is capable of becoming deposited in interstices by condensation from the gaseous phase.

In one embodiment of the method, the tempering is implemented in a temperature range from 190° C. to 240° C. in an oxygen-containing atmosphere. In the above-mentioned temperature range, the scintillator layer is stable, whereas suitable protective layers become colored at these temperatures and with a supply of oxygen.

In one embodiment of the scintillator layer, the scintillator layer forms microstructures such that interstices form between the microstructures essentially perpendicularly to the surface of the scintillator plate toward the substrate.

The microstructure with the interstices extending essentially perpendicularly from the surface of the scintillator plate toward the substrate conducts the light photons generated through conversion of the X-rays and gamma rays, via total reflection, to border surfaces of the microstructures within the scintillator layer, e.g., in the direction toward the surface of the scintillator plate. Due to the small dimensions of the microstructure in the direction parallel to the surface of the scintillator plate, the light photons generated within a microstructure are guided to an area that corresponds to the small dimensions of the microstructure. Because the protective layer, which extends into the interstices between the microstructures, has an appreciable absorption for light photons, the protective layer absorbs the light photons scattered from the microstructure with a high probability and thereby improves the contrast and the resolution of the scintillator plate. Because the protective layer extends only partially into the interstices between the microstructures, and because a region that adjoins the buffer layer remains free, the border surfaces of the microstructure in this region are not in contact with the protective layer. Because the refractive index of the material of the scintillator layer differs more strongly from the surroundings than from the material of the protective layer, the limiting angle for total reflection in the region in which the protective layer does not extend is greater. Therefore, in this region, a greater proportion of the light photons generated in the microstructure by the X-ray or gamma photons is reflected back into the microstructure at the border surface and is guided away from the substrate in the microstructure.

In one embodiment of the method, the scintillator layer includes caesium iodide and is deposited onto the buffer layer. Caesium iodide is distinguished by a good efficiency level for the conversion of X-ray photons into light photons. Furthermore, caesium iodide tends, when deposited on the substrate, to arrange itself into needle-like microstructures perpendicularly to the surface of the substrate, the microstructures acting as light guides and guiding the majority of the light photons generated in the interior of the microstructures to the surface.

In one embodiment of the scintillator plate, the scintillator plate has microstructures with interstices. The interstices extend essentially perpendicularly to the surface of the scintillator plate toward the substrate. The microstructure conducts the light photons generated through conversion of the X-rays and gamma rays, via total reflection at border surfaces of the microstructures within the scintillator layer, e.g., in the direction toward the surface of the scintillator plate. Due to the small dimensions of the microstructure in the direction parallel to the surface of the scintillator plate, the light photons generated within a microstructure are guided to an area that corresponds with the small dimensions of the microstructure.

In one embodiment of the scintillator plate, the scintillator layer includes caesium iodide. Caesium iodide is distinguished by a good efficiency level for the conversion of X-ray photons into light photons. Furthermore, due to the self-organization thereof, caesium iodide tends to be arranged in needle-like microstructures that are oriented perpendicularly to the surface of the substrate.

The buffer layer and/or the protective layer may include one of parylene C, parylene N or parylene D. A buffer layer or protective layer made of parylene C is impermeable to water and is configured to protect the microstructures of the scintillator layer against moisture, which may be useful, e.g., for the hygroscopic caesium iodide. Furthermore, parylene C is suitable, during deposition from the gaseous phase, also to extend into interstices in the substrate or between the microstructures.

In one embodiment, the buffer layer and/or the protective layer of parylene includes a proportion of carbonyl groups of, for example, greater than 5000 ppm, which causes a yellowish coloration. The coloration and the raised oxygen content may be limited to regions of the layer. The coloration is useful because absorption of light in the visible wavelength region is provided without the buffer layer and/or the protective layer being changed by pigments or coloring agents.

BRIEF DESCRIPTION OF THE DRAWINGS

FIG. 5 is a graphical representation of transmission spectra of a layer of parylene before and after tempering.

DETAILED DESCRIPTION

Figure 1:
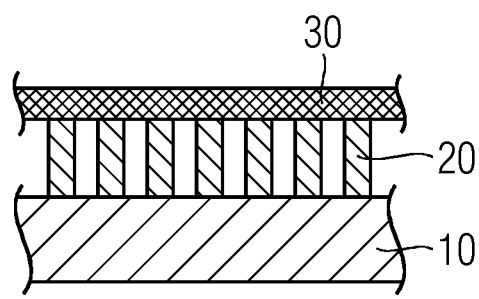
FIG. 1 is a cross-section through a scintillator plate with a small thickness of the scintillator layer according to the prior art.

FIG. 1 is a cross-section through a scintillator plate 1 according to the prior art. The scintillator plate 1 has a substrate 10 on which a scintillator layer 20 is arranged. If the material of the scintillator layer 20 is caesium iodide, then when growing on the substrate 10, the material forms microstructures in the form of columns or needles that extend away from the substrate 10. The scintillator layer 20 is relatively thin, typically thinner than, for example, 300 µm, so that the individual columns or needles are separate from one another. Arranged on the scintillator layer 20 is a protective layer 30, which is intended to protect the scintillator layer 20 against environmental influences. Such environmental influences may be dirt, liquids, gases or moisture.

Figure 2:
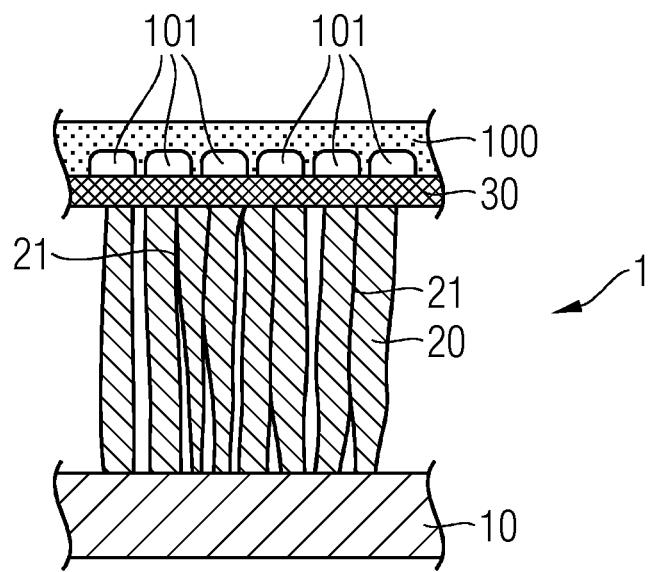
FIG. 2 is a cross-section through a scintillator plate with a large thickness of the scintillator layer according to the prior art.

FIG. 2 shows, by contrast, a scintillator plate 1 with a scintillator layer 20 made of caesium iodide, as is typical for a thickness of 1000 µm. The individual microstructures in the form of columns or needles tend, at this thickness, to come into contact with one another at contact sites 21.

Figure 3:
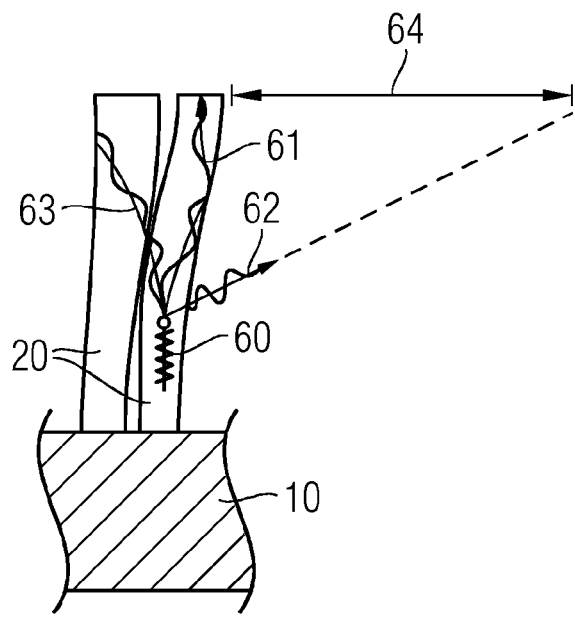
FIG. 3 is a schematic view of a portion of the scintillator plate of FIG. 2.

FIG. 3 shows, in a detail view of FIG. 2, how X-ray radiation incident in the scintillator layer 20 is converted into visible light and how this light spreads out. An X-ray photon 60 interacts, at a respective probability, with the electrons of the scintillator layer 20 (by absorption, Compton effect). Due to the changes caused thereby in the electron shells of atoms of the scintillator layer 20, photons 62, 63 are emitted by the atoms at energies in the visible light region. A portion of the light photons 62 impinges at a steep angle on outer border surfaces of the microstructures of the scintillator layer 10, so that these light photons 62 leave the microstructure. Another portion of the light photons 61 is incident on the outer border surface of the microstructure at an angle smaller than the angle for total reflection and is completely reflected back into the microstructure. These light photons 61 are therefore conducted by the microstructure along the microstructure as by a light guide. However, if the outer border surface is in contact with another microstructure, then a light photon 63 may also cross over into an adjacent microstructure. Both the light photons 62 that leave the microstructure as well as the light photons 63 that cross over into other microstructures leave the scintillator layer at a distance 64 from the microstructure in which the X-ray photon was converted. These light photons 62, 63 therefore worsen both the spatial resolution and the contrast of the image generated by the scintillator plate 1.

Figure 4:
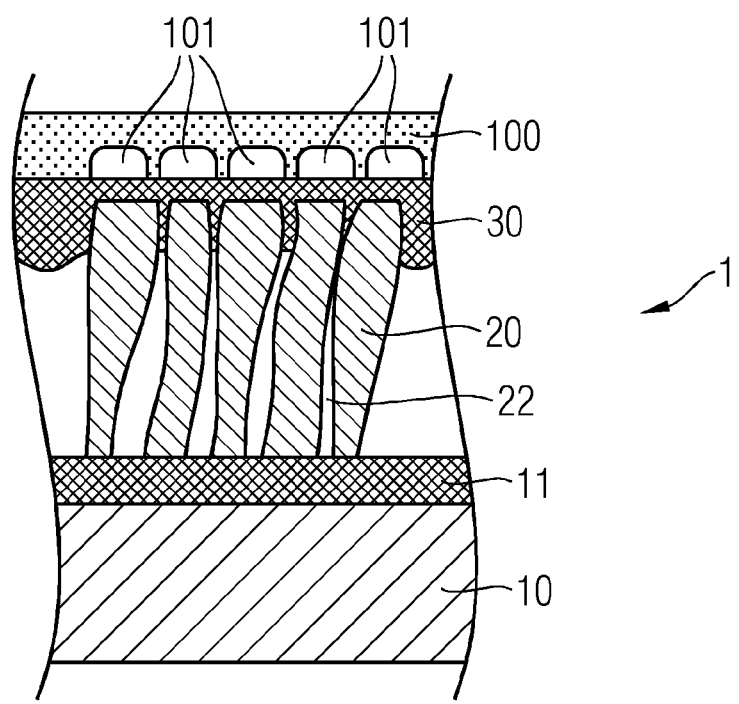
FIG. 4 is a schematic, cross-sectional view of a scintillator plate configured in accordance with one embodiment.

FIG. 4 shows a cross-section through a scintillator plate 1 according to one embodiment. The scintillator plate 1 includes a substrate 10 onto which a buffer layer 11 is applied. Arranged thereon is the scintillator layer 20. The scintillator layer 20 is structured into microstructures between which interstices 22 extend from an upper side facing toward a photodetector 100 to the substrate 10. The interstices 22 extend essentially perpendicularly to the surface of the substrate 10.

The protective layer 30 is applied to the upper side facing toward the photodetector 100 and extends into the interstices 22 between the microstructures of the scintillator layer 20. The protective layer 30 may extend into the interstices 22 whilst with thin layers the protective layer 30 extends as far as the buffer layer 11. The protective layer 30 may extend into the interstices 22 only part of the way from the upper side facing toward the photodetector 100 to the buffer layer 11. The protective layer 30 may extend from the upper layer up to 500 µm into the interstices 22.

The protective layer 30 is colored so as to absorb visible light appreciably. The coloration relates both to a region of the protective layer 30 applied to the upper side facing toward the photodetector 100, as well as to a region of the protective layer 30 that extends into the interstices 22 between the microstructures of the scintillator layer 20. A significant to overwhelming proportion of light photons 62, 63 that leave the microstructures of the scintillator layer 20 are absorbed by the protective layer 30 within the dimensions of the scintillator layer 20. This may be, for example, a coloration in which at least 10% of the light is absorbed in a propagation distance of 1000 µm.

However, the buffer layer 11 may also or only be colored. A colored buffer layer 11 reduces the number of light photons propagating in the direction of the substrate 10 and being reflected therefrom. Due to the angular distribution and the large distance that these light photons have to cover to the detector on the side of the scintillator plate 1 facing away from the substrate, the photons are distributed over a wide region. If, however, the light photons are absorbed in the colored buffer layer 11, the resolution and the contrast of the scintillator plate 1 increase accordingly.

The coloration may be evoked, for example, by the formation of carbonyl groups in the buffer layer 11 and/or the protective layer 30, if these are made, for example, of parylene. The carbonyl groups are noticeable, e.g., due to a yellowish coloration, which may also become a brownish color tone. A possible route to creating the carbonyl groups is described in the method set forth below. For example, the coloration may be provided via a carbonyl proportion in the protective layer of more than 5000 ppm. The presence of the carbonyl groups in an infrared spectrum of parylene may also be shown through absorption at the wave number of 1700 $cm^{-1}$. FIG. 5 shows a corresponding transmission spectrum 110 of a parylene layer before tempering and a transmission spectrum 120 following tempering. Shown on the y-axis is the transmission in percentage values. Shown on the x-axis is the wavelength of the infrared light in the form of the wave number. Shown in the spectrum 120 is an absorption peak 121 at a wave number of approximately 1700 $cm^{-1}$, which is caused by the carbonyl groups and is not visible in the spectrum 110 before the tempering. In order to determine a relative concentration of the carbonyl groups, a ratio of the amplitude of the peak to the amplitude of an absorption line of the parylene, which is not changed by the tempering, may be taken. For this purpose, the absorption peak 112, 122 at the wave number of 820 $cm^{-1}$ may be used, which represents an out-of-plane deformation oscillation of the C—H-bond in the aromatic ring of the parylene.

A corresponding coloration occurs if a quotient of the relevant absorption at the absorption peak of the wave number 820 cm$^{-1}$ due to the relative absorption at the absorption peak of the wave number 1700 cm$^{-1}$ is smaller than 10.

Arranged on the upper side of the scintillator layer 20 facing away from the substrate 10 and having the protective layer 30 is a photodetector 100. The photodetector 100 may be, for example, a 2-dimensional CCD matrix for recording a 2-dimensional X-ray image. The CCD matrix may have active elements made of crystalline semiconductors. A one-dimensional detector row may be moved over the scintillator plate 1 as the photodetector 100. Photodiode arrays made of amorphous silicon may be used as the photodetector 100. A maximum resolution is achieved when the dimensions of the individual detector elements 101 correspond to the cross section of the microstructures in the scintillator layer 20 on the upper side. Smaller detector elements do not result in a higher resolution because, in the total reflections of the light photons in the microstructure, the spatial information regarding the X-ray photon becomes lost in the microstructure.

The substrate itself may be sufficiently thin and transparent or may be a fiber optic plate, so that the photodetector is arranged on the side of the substrate 10 facing away from the scintillator layer 20. With a suitable photodetector that undergoes the process steps for generating the scintillator layer 20 without significant worsening of the detection properties, the scintillator layer 20 may be applied directly, or on a layer 11, onto the photodetector.

A method for manufacturing a scintillator plate 1 is now described.

A suitable substrate 10 is provided. Essentially all materials having a sufficiently clean and even surface for the growth of a scintillator layer 20 are suitable as the substrate. At the same time, the substrate is transparent to X-ray radiation 60. For example, glass, aluminum or amorphous carbon may be used as the material for the substrate.

A buffer layer 11 may be applied to one of the above-mentioned base materials of the substrate 10. The buffer layer 11 may be made of the same substances as the protective layer 30 and the substances are suitable, due to the particularly good properties thereof, both to protect a subsequent scintillator layer 20 against environmental influences and to form a suitable base for deposition of the scintillator layer, and are considered in greater detail below in relation to the protective layer 30.

The buffer layer 11 may be colored with one of the methods described in relation to the protective layer 30.

As stated above, the photodetector 100 may be used as the substrate 10.

In a further act, a scintillator layer 20 is applied to the substrate 10. In one embodiment, caesium iodide serves as the scintillator material. Caesium iodide may be vapor-deposited under vacuum and becomes deposited on the substrate. During the deposition, the caesium iodide grows perpendicularly away from the surface of the substrate 10 in column-shaped or needle-shaped microstructures. As mentioned above in relation to the scintillator plate 10, these microstructures are useful for the imaging properties thereof. Furthermore, caesium iodide distinguishes itself, e.g., when doped with thallium, by an effective conversion of X-rays into visible light.

Other materials are also possible, which are suitable for converting X-ray radiation into visible light. Even if these materials do not themselves tend toward microstructuring, such structuring may be possible using technical means. Structuring of this type, for example, may be possible via photolithographic methods of semiconductor technology. For example, $Gd_2O_2S$ may be used.

In a further act, a protective layer 30 is applied to the scintillator layer 20. For example, caesium iodide is hygroscopic and requires protection against contact with moisture.

In one embodiment, parylene C, which belongs together with the other parylenes to the group of poly-p-xylylenes, is applied as the protective layer 30. The deposition of parylene C is implemented from a gaseous phase without solvent. The starting molecules polymerize to a protective layer 30 directly onto the surface of the scintillator layer 20. In this process, the individual gaseous starting molecules are also capable of penetrating into interstices 22 of the scintillator layer 20 and of forming a protective layer 30 there that also extends into the interstices 22.

However, other materials may be used for the protective layer 30, provided the materials are tolerable with the respective materials of the scintillator layer 20 and are capable of forming into a protective layer extending into the interstices 22 between the microstructures. These materials may be, for example, other substances of the substance group of poly-p-xylylenes, such as parylene D or parylene N or also epoxy resins.

In one embodiment of the method, in a further act, the protective layer 30 is colored by tempering. By heating the protective layer 30 to a temperature in a range between 190° C. and 240° C. in an oxygen-containing atmosphere, the protective layer of parylene C becomes colored yellowish to yellow-brownish, depending on the temperature and duration of the heat treatment. Below 190° C., the coloration occurs so slowly that practicable production is not possible. Above 240° C., the structural stability and therefore the protective effect of the protective layer of parylene C no longer exists. Through tempering given these conditions, oxidation of the parylene occurs, so that oxygen is included into the parylene layer as carbonyl groups, which leads to the desired yellowish or brownish coloration. In one embodiment, the proportion of carbonyl groups in the protective layer 30 or in portions of the protective layer 30 amounts to more than 5000 ppm.

Due to the coloration achieved, light photons are absorbed in the interstices 22 and, as a result, as described above, the contrast and resolution are improved.

Coloration through tempering may also be achieved with protective layers 30 other than those mentioned above made of parylene C. The process parameters of duration, temperature and atmosphere composition are dependent on the respective materials of the protective layer 30. A possible material for the protective layer 30 may be, for example, an epoxy resin.

The protective layer 30 may be already colored when the layer is applied. This may be possible, for example, in the case of gas deposition, in that a further component is added during the creation of the protective layer 30, provided this does not color the scintillator layer 20 itself.

The protective layer 30 may be colored following application, using a suitable coloring method. For example, the protective layer 30 may be exposed to a further gaseous component, provided this does not damage the scintillator layer 20.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for manufacturing a scintillator plate, the method comprising:
   providing a substrate;
   applying a buffer layer to the substrate;
   applying a scintillator layer to the substrate;
   applying a protective layer to the scintillator layer;
wherein the buffer layer, the protective layer, or both the buffer layer and the protective layer are colored by tempering following the application thereof, wherein the tempering is implemented in a temperature range from 190° C. to 240° C. in an oxygen-containing atmosphere.

2. The method of claim 1, wherein the buffer layer, the protective layer, or both the buffer layer and the protective layer are made of one of parylene C, parylene N and parylene D.

3. The method of claim 2, wherein the scintillator layer forms microstructures such that interstices form between the microstructures essentially perpendicularly to the surface of the scintillator plate toward the substrate, wherein the protective layer penetrates into the interstices during application.

4. The method of claim 1, wherein the scintillator layer forms microstructures such that interstices form between the microstructures essentially perpendicularly to the surface of the scintillator plate toward the substrate, wherein the protective layer penetrates into the interstices during application.

5. The method of claim 4, wherein the scintillator layer comprises caesium iodide.

6. The method of claim 1, wherein the scintillator layer forms microstructures such that interstices form between the microstructures essentially perpendicularly to the surface of the scintillator plate toward the substrate, wherein the protective layer penetrates into the interstices during application.

* * * * *